(12) United States Patent
Lee et al.

(10) Patent No.: US 12,366,007 B2
(45) Date of Patent: Jul. 22, 2025

(54) METHOD OF DEPOSITING $Ga_2O_3$ CRYSTAL FILM ACCORDING TO HYDRIDE VAPOR PHASE EPITAXY BY SUPPLYING GaCl GAS, OXYGEN, AND HCl GAS

(71) Applicant: LumiGNtech Co., Ltd., Gyeonggi-do (KR)

(72) Inventors: Hae Yong Lee, Gwangmyeong-si (KR); Young Jun Choi, Seoul (KR); Hae Gon Oh, Gwangmyeong-si (KR)

(73) Assignee: LumiGNtech Co., Ltd., Gyeonggi-do (KR)

( * ) Notice: Subject to any disclaimer, the term of this patent is extended or adjusted under 35 U.S.C. 154(b) by 114 days.

(21) Appl. No.: 17/818,384

(22) Filed: Aug. 9, 2022

(65) Prior Publication Data

US 2023/0193509 A1 Jun. 22, 2023

(30) Foreign Application Priority Data

Dec. 22, 2021 (KR) .................. 10-2021-0185166

(51) Int. Cl.
*C30B 25/14* (2006.01)
*C30B 25/16* (2006.01)
(Continued)

(52) U.S. Cl.
CPC .............. *C30B 25/14* (2013.01); *C30B 25/16* (2013.01); *C30B 29/16* (2013.01); *C30B 35/00* (2013.01)

(58) Field of Classification Search
CPC ......... C30B 25/00; C30B 25/02; C30B 25/10; C30B 25/14; C30B 25/16; C30B 25/165;
(Continued)

(56) References Cited

U.S. PATENT DOCUMENTS

2015/0249189 A1 9/2015 Sato
2019/0055646 A1* 2/2019 Oshima .................. C23C 16/06
(Continued)

FOREIGN PATENT DOCUMENTS

CN 104726935 A 6/2015
CN 111663181 A * 9/2020 ........... C30B 25/183
(Continued)

OTHER PUBLICATIONS

Yuichi Oshima et al., "Halide vapor phase epitaxy of twin-free α-Ga2O3 on sapphire (0001) substrates", Applied Physics Expres, vol. 8, No. 5, pp. 055501-1 to 055501-4, doi: 10.7567/APEX.8.055501, Apr. 8, 2015.
(Continued)

*Primary Examiner* — Kenneth A Bratland, Jr.
(74) *Attorney, Agent, or Firm* — Studebaker Brackett PLLC

(57) ABSTRACT

The present invention relates to a $Ga_2O_3$ crystal film deposition method according to HVPE, a deposition apparatus, and a $Ga_2O_3$ crystal film-deposited substrate using the same. According to an embodiment of the present invention, a $Ga_2O_3$ crystal film deposition method, which includes a first step of supplying GaCl gas onto a single-crystal semiconductor substrate via a central supply channel and a second step of supplying oxygen and HCl gas onto the single-crystal semiconductor substrate onto which the GaCl gas is supplied, is provided.

6 Claims, 13 Drawing Sheets

(51) Int. Cl.
*C30B 29/16* (2006.01)
*C30B 35/00* (2006.01)

(58) Field of Classification Search
CPC ......... C30B 29/00; C30B 29/10; C30B 29/16; C30B 35/00; C23C 16/00; C23C 16/22; C23C 16/30; C23C 16/40; C23C 16/44; C23C 16/448; C23C 16/4481; C23C 16/455; C23C 16/45502; C23C 16/45514
USPC ......... 117/84, 88–90, 93, 99, 102, 106, 937, 117/944
See application file for complete search history.

(56) References Cited

U.S. PATENT DOCUMENTS

| | | | |
|---|---|---|---|
| 2019/0055667 A1 | 2/2019 | Oshima et al. | |
| 2019/0088816 A1* | 3/2019 | Mori | C30B 33/06 |
| 2021/0388529 A1 | 12/2021 | Mori et al. | |

FOREIGN PATENT DOCUMENTS

| | | |
|---|---|---|
| EP | 3 054 037 A1 | 8/2016 |
| JP | 2017-109902 A | 6/2017 |
| JP | 2019-034882 A | 3/2019 |
| JP | 2020-001997 A | 1/2020 |
| JP | 6744523 B2 | 8/2020 |
| JP | WO2020/217564 A1 | 5/2021 |
| KR | 10-2020-0125073 A | 11/2020 |
| TW | 201435164 A | 9/2014 |
| WO | 2020/194802 A1 | 10/2020 |
| WO | 2020/217564 A1 | 10/2020 |
| WO | 2021/210476 A1 | 10/2021 |

OTHER PUBLICATIONS

S. A. Kukushkin et al., "Epitaxial Gallium Oxide on a SiC/Si Substrate", Physics of the Solid State, vol. 58, No. 9, pp. 1876-1881, https://doi.org/10.1134/S1063783416090201, Sep. 17, 2016.

The extended European search report issued by the European Patent Office on Jul. 17, 2023, which corresponds to European Patent Application No. 22188912.4-1103 and is related to U.S. Appl. No. 17/818,384.

An Office Action issued by Taiwan Intellectual Property Office on Jun. 13, 2023, which corresponds to Taiwanese Patent Application No. 111130650 and is related to U.S. Appl. No. 17/818,384.

An Office Action; "Notice of Reasons for Refusal," mailed by the Japanese Patent Office on Mar. 5, 2024, which corresponds to Japanese Patent Application No. 2022-125784 and is related to U.S. Appl. No. 17/818,384.

* cited by examiner

FIG. 5

|  | 50 x | 200 x | 500 x |
|---|---|---|---|
| No. 1 | | | |
| No. 2 | | | |
| No. 3 | | | |
| No. 4 | | | |

| | As grown | After CMP |
|---|---|---|
| No. 2 |  |  |
| No. 3 |  |  |
| No. 4 |  |  |

FIG. 11

| # | Ga_HCl | O2 | Bypass Additional Supply(HCl) | GT(m) | Δt | Growth Rate (μm/min) | FWHM of RC (002) | FWHM of RC (-402) | Ra-x | Rt-x | Ra-y | Rt-y | Note |
|---|---|---|---|---|---|---|---|---|---|---|---|---|---|
| 1 | 50 | 70 | 10 | 120 | 13 | 0.11 | 78 | 83 | 4.02 | 582.52 | 0.5 | 4.03 | Comparative Example |
| 2 | 50 | 70 | 20 | 120 | 7.5 | 0.06 | 40 | 95 | 5.37 | 708.66 | 0.55 | 4.26 | Comparative Example |
| 3 | 100 | 100 | 10 | 120 | 21 | 0.18 | 39 | 49 | 2.2 | 77.26 | 0.52 | 5.15 | Example |
| 4 | 100 | 100 | 20 | 120 | 17 | 0.14 | 25 | 31 | 3.84 | 319.22 | 0.44 | 4.08 | Example |
| 5 | 200 | 200 | 10 | 60 | 20 | 0.33 | 33 | 106 | 3.21 | 377.26 | 1.31 | 26.2 | Example |
| 6 | 200 | 200 | 20 | 60 | 15 | 0.25 | 26 | 52 | 5.84 | 519.22 | 0.61 | 5.11 | Example |
| 7 | 300 | 800 | None | 12 | 31 | 2.58 | 273 | 578 | 181 | 4177 | 109 | 1622 | Comparative Example |
| 8 | 300 | 800 | None | 12 | 28 | 2.33 | 118 | 210 | 63 | 1116 | 9 | 613 | Comparative Example |
| 9 | 400 | 1000 | 20 | 18 | 133 | 7.39 | 958 | 1089 | 18 | 388 | 200 | 2689 | Comparative Example |
| 10 | 400 | 1000 | 40 | 18 | 41 | 2.28 | 249 | 473 | 25 | 703 | 373 | 3098 | Comparative Example |
| 11 | 450 | 1000 | 20 | 18 | 157 | 8.72 | 652 | 935 | 26 | 412 | 247 | 1779 | Comparative Example |
| 12 | 450 | 1000 | 40 | 18 | 115 | 6.39 | 988 | 953 | 104 | 2034 | 332 | 2746 | Comparative Example |
| 13 | 500 | 1000 | 20 | 16 | 146 | 9.13 | 786 | 1169 | 94 | 2019 | 279 | 2400 | Comparative Example |
| 14 | 600 | 1000 | 20 | 15 | 153 | 10.20 | 243 | 214 | 26 | 218 | 80 | 3097 | Comparative Example | even # METHOD OF DEPOSITING $Ga_2O_3$ CRYSTAL FILM ACCORDING TO HYDRIDE VAPOR PHASE EPITAXY BY SUPPLYING GaCl GAS, OXYGEN, AND HCl GAS

CROSS-REFERENCE TO RELATED APPLICATION

This application claims priority to and the benefit of Korean Patent Application No. 2021-0185166, filed on Dec. 22, 2021, the disclosure of which is incorporated herein by reference in its entirety.

BACKGROUND

1. Field of the Invention

The present invention relates to a $Ga_2O_3$ crystal film deposition method according to HVPE, a deposition apparatus, and a $Ga_2O_3$ crystal film-deposited substrate using the same, and more specifically, to a $Ga_2O_3$ crystal film deposition method and deposition apparatus, which allow surface defects to be minimized, and a crystal film-deposited substrate using the same.

2. Discussion of Related Art

As conventional Si-based power semiconductor devices have reached a limit on performance improvement compared to technological development due to their limitations on intrinsic physical properties, an industrial need for power semiconductor materials having wide bandgap (WBG) and ultrawide bandgap (UWB) characteristics is gradually expanding.

UWB $Ga_2O_3$ materials are next-generation power semiconductor wafers having price competitiveness because the manufacturing cost thereof is about ⅓ to ⅕ of that of GaN or SiC.

In particular, in the case of the UWB $Ga_2O_3$ materials, a thin film can be allowed to grow as thin as about ⅓ in order to exhibit the same breakdown voltage due to having breakdown voltage resistance resulting from the bandgap, and since the growth is not high-temperature growth, the corresponding cost can be reduced A $Ga_2O_3$ epitaxy technique is a technique in which a $\beta$-$Ga_2O_3$ single-crystal layer is allowed to grow on the same type of a $\beta$-$Ga_2O_3$ substrate or an $\alpha$-$Ga_2O_3$ single-crystal layer is allowed to grow on a different type of a substrate such as sapphire or the like, and includes a technique for obtaining a high-quality single-crystal layer and a doping technique for obtaining n-type characteristics.

$Ga_2O_3$ materials are present mainly in the most stable form $\beta$-$Ga_2O_3$ and present in four forms ($\alpha$, $\beta$, $\delta$, and $\epsilon$).

$\beta$-$Ga_2O_3$ has the most stable structure at high temperature and ingot growth is easy, $\alpha$-$Ga_2O_3$ has a relatively stable structure at a low temperature of 500° C. or less, and both of the remaining forms have a meta-stable structure and is present in an unstable state.

$\beta$-$Ga_2O_3$ materials have a band gap of about 4.8 to 4.9 eV and a monoclinic structure and have difficulty in surface processing due to many surface defects generated during deposition and cleavage characteristics. Accordingly, the development of a $Ga_2O_3$ epitaxy technique for reducing surface defects of the grown epilayer is in progress.

In recent years, Japanese Patent Registration No. 6744523 (filed on Aug. 4, 2020) proposed a growth method in the direction that allows surface defects to be minimized using hydride vapor phase epitaxy (HVPE).

However, since this method limits a deposition direction to a specific direction, there is a problem in that deposited surfaces cannot be formed in various crystal directions.

Therefore, there is a need for the development of a $Ga_2O_3$ epitaxy technique capable of diversifying a deposition direction and minimizing surface defects.

Meanwhile, the above-described background art cannot necessarily be said to be a known technology disclosed to the general public prior to the filing of the present invention.

RELATED-ART DOCUMENTS

Patent Documents (Patent Document 0001) Japanese Patent Registration No. 6744523

SUMMARY OF THE INVENTION

An embodiment of the present invention is directed to providing a $Ga_2O_3$ crystal film deposition method according to hydride vapor phase epitaxy (HVPE), a deposition apparatus, and a $Ga_2O_3$ crystal film-deposited substrate using the same, which are capable of diversifying a growth direction to achieve a high degree of freedom for growth of a $Ga_2O_3$ crystal film and minimizing the number and depth of defects.

One aspect of the present invention provides a method of depositing a $Ga_2O_3$ crystal film according to HVPE, which includes a first step of supplying GaCl gas onto a single-crystal semiconductor substrate via a central supply channel and a second step of supplying oxygen and HCl gas onto the single-crystal semiconductor substrate onto which the GaCl gas is supplied.

According to one aspect of the present invention, the HCl gas may be supplied via a bypass supply channel separated from the central supply channel.

According to one aspect of the present invention, the HCl gas may be supplied along with nitrogen.

According to one aspect of the present invention, the HCl gas may be supplied at a flow rate of 10 SCCM or more.

According to one aspect of the present invention, a ratio of the partial pressures of the HCl gas and the GaCl gas may be equal to or more than 1:5.

According to one aspect of the present invention, a ratio of the partial pressures of the HCl gas and the GaCl gas may be equal to or more than 2:5.

According to one aspect of the present invention, a ratio of the partial pressures of the GaCl gas and the HCl gas may be more than 5:4.

According to one aspect of the present invention, the first step may include supplying HCl gas for a gallium reaction at a flow rate of 50 SCCM or more and 300 SCCM or less to gallium.

Another aspect of the present invention provides an apparatus for depositing a $Ga_2O_3$ crystal film, which includes a central supply channel configured to supply GaCl gas and connected to a reaction portion, a bypass supply channel separated from the central supply channel, configured to supply oxygen and HCl gas, and connected to the reaction portion, and the reaction portion on which a $Ga_2O_3$ substrate is mounted.

According to another aspect of the present invention, the central supply channel and the bypass supply channel may be controlled at 450° C. or more and 900° C. or less.

According to another aspect of the present invention, the central supply channel and the bypass supply channel may be controlled so that the temperatures thereof gradually increase from an inlet to a region where the GaCl gas moves by evaporation.

According to another aspect of the present invention, the central supply channel and the bypass supply channel may be divided into an injection portion, an evaporation portion, and a transfer portion from an inlet to a region where the GaCl gas moves by evaporation, the injection portion may be controlled at 450° C. or more and 650° C. or less, the evaporation portion may be controlled at 550° C. or more and 750° C. or less, and the transfer portion may be controlled at 750° C. or more and 900° C. or less.

According to another aspect of the present invention, the reaction portion may be controlled at 850° C. or more and 1150° C. or less.

According to another aspect of the present invention, the reaction portion may be divided into an introduction portion, a deposition portion, and a discharge portion from a region close to the central supply channel and the bypass supply channel to a region where a reaction gas is discharged, the introduction portion may be controlled at 950° C. or more and 1150° C. or less, the deposition portion may be controlled at 900° C. or more and 1050° C. or less, and the discharge portion may be controlled at 850° C. or more and 950° C. or less.

Still another aspect of the present invention provides a $Ga_2O_3$ crystal film-deposited substrate in which the density of defects found on a surface of the substrate in the as-grown state is $4.57 \times 10^4/cm^2$ or less.

According to still another aspect of the present invention, when the substrate surface is subjected to chemical mechanical polishing (CMP) at a pressure of 100 $g/cm^2$ for 180 minutes or less, defects on the substrate surface may be completely polished.

According to still another aspect of the present invention, the substrate may have a full width half-maximum (FWHM) value for (002) and (−402) planes of 100 arcsec or less, a surface roughness Ra of 300 nm or less, and a surface roughness Rt of 2500 nm or less.

According to still another aspect of the present invention, the substrate may have a defect density of $2.29 \times 10^4/cm^2$ or less, a FWHM value for (002) and (−402) planes of 100 arcsec or less, a Ra of 71 nm or less, and a Rt of 1150 nm or less.

According to still another aspect of the present invention, the substrate may have a defect density of $1.14 \times 10^4/cm^2$ or less, a FWHM value for (002) and (−402) planes of 30 arcsec or less, a Ra of 11.42 nm or less, and a Rt of 203.20 nm or less.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 5 is a table showing images obtained by photographing surfaces according to a comparative example and examples shown in Tables 1 and 2 with an optical microscope at 50×, 200×, and 500×;

FIG. 11 is a table illustrating examples and comparative examples of a $Ga_2O_3$ deposition method according to HVPE according to an embodiment of the present invention.

DETAILED DESCRIPTION OF EXEMPLARY EMBODIMENTS

Figure 1:
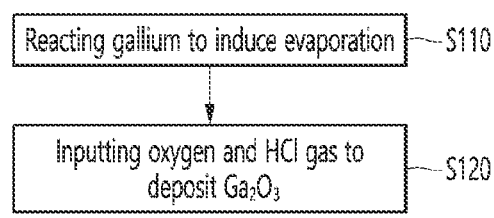
FIG. 1 is a flowchart of a $Ga_2O_3$ deposition method according to HVPE according to an embodiment of the present invention.

Hereinafter, exemplary embodiments of the present invention will be described in detail with reference to accompanying drawings so that those skilled in the art can easily carry out the present invention. However, it should be understood that the present invention can be implemented in various forms, and that it is not intended to limit the present invention to the exemplary embodiments. Also, in the drawings, descriptions of parts unrelated to the detailed description are omitted to clearly describe the present invention. Throughout the specification, like numbers refer to like elements.

Throughout the specification, a certain part being "connected" to another part means that the certain part is "directly connected" to the other part or that the certain part is "indirectly connected" to the other part through another member interposed between the two parts. Also, a certain part "including" a certain element signifies that the certain part may further include, instead of excluding, another element unless particularly indicated otherwise.

Figure 2:
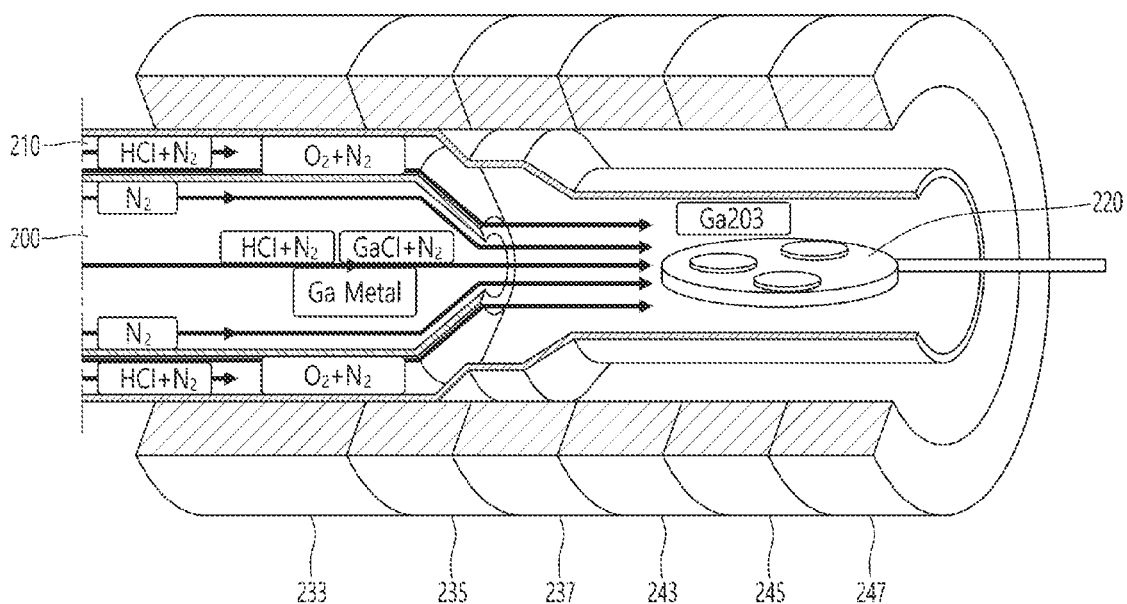
FIG. 2 is a conceptual diagram illustrating a deposition apparatus for performing a $Ga_2O_3$ deposition method according to HVPE according to an embodiment of the present invention and a reaction process.
Figure 3:
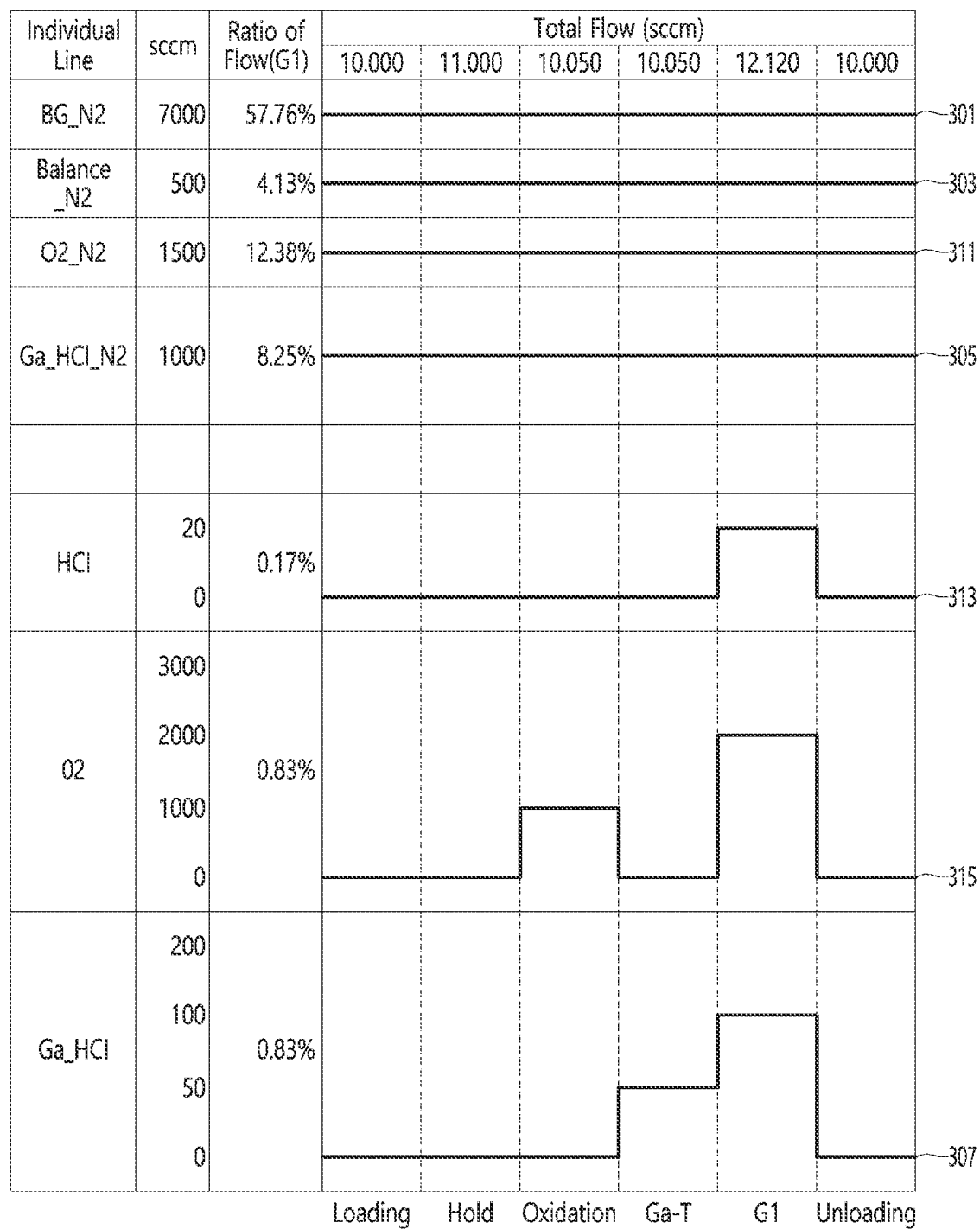
FIG. 3 is a graph illustrating a flow rate of gas input in each line of the deposition apparatus of FIG. 2 according to an embodiment of the present invention.
Figure 4:
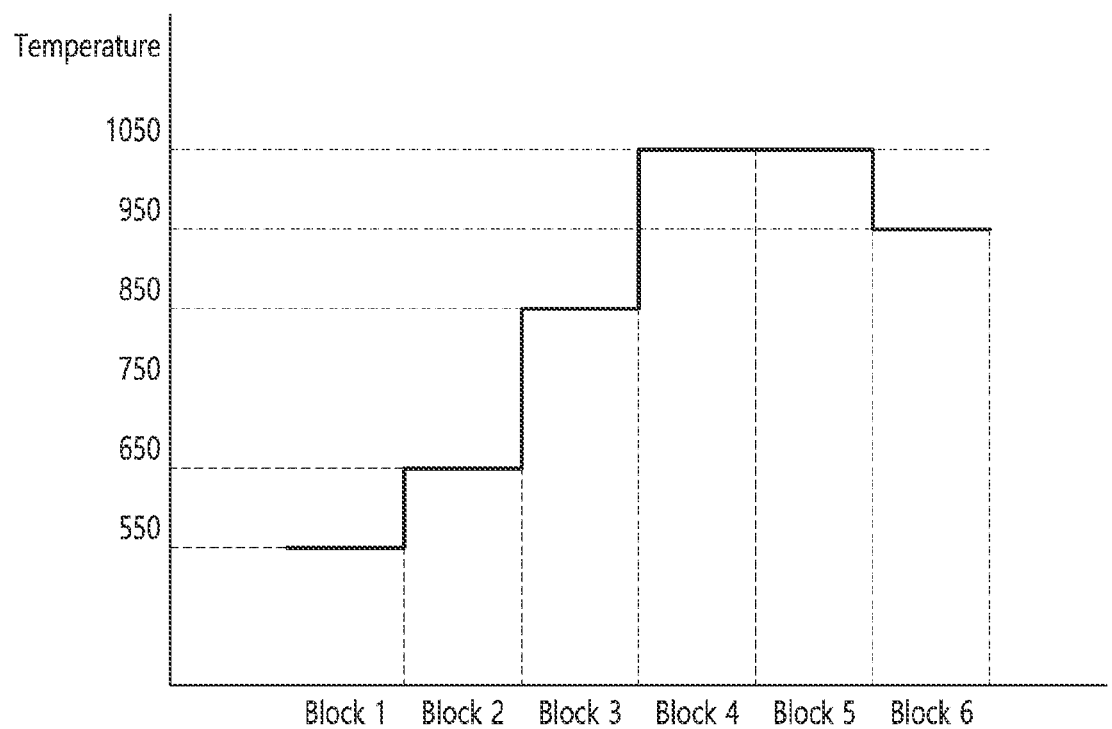
FIG. 4 is a graph illustrating a control temperature of each block in the deposition apparatus of FIG. 2.

Hereinafter, the present invention will be described in detail with reference to accompanying drawings FIG. 1 is a flowchart of a $Ga_2O_3$ deposition method according to HVPE according to an embodiment of the present invention, and FIG. 2 is a conceptual diagram illustrating a deposition apparatus for performing a $Ga_2O_3$ deposition method according to HVPE according to an embodiment of the present invention and a reaction process. FIG. 3 is a graph illustrating a flow rate of gas input in each line of the deposition apparatus of FIG. 2 according to an embodiment of the present invention. FIG. 4 is a graph illustrating a control temperature of each block in the deposition apparatus of FIG. 2.

The present invention will be described with reference to FIG. 1 to FIG. 4.

A method of depositing a $Ga_2O_3$ crystal film according to hydride vapor phase epitaxy (HVPE) includes a first step of supplying GaCl gas onto a single-crystal semiconductor substrate via a central supply channel and a second step of supplying oxygen and HCl gas onto the single-crystal semiconductor substrate onto which the GaCl gas is supplied.

In this case, the HCl gas may be supplied along with nitrogen.

The HCl gas may serve to etch a deposited surface portion with high surface energy during deposition. In this case, a portion with high curvature is selectively etched due to having high surface energy. Therefore, HCl gas may be added during deposition to form a deposited surface while minimizing the portion with high curvature, and thus surface roughness may be decreased.

In HVPE, a material for vaporizing gallium, which is a raw material, is HCl gas. Since HCl gas is an oxidizing material, the same HCl gas may be added during deposition.

When GaCl gas reacts with oxygen, a ratio of HCl gas and the reactant gas needs to be strictly maintained, so HCl gas may be supplied via a bypass supply channel separated from a central supply channel configured to supply GaCl gas. Specifically, HCl gas may be supplied at a flow rate of 10 SCCM or more.

In this case, a ratio of the partial pressures of the HCl gas and the GaCl gas may be equal to or more than 1:5, preferably, equal to or more than 2:5. The reason why this ratio is efficient is described below with reference to FIG. 5 and Table 1.

When a ratio of the partial pressures of the GaCl gas and the HCl gas is in a range of less than 5:4, a deposition rate is excessively lowered. Therefore, it is preferable that the ratio is more than 5:4.

The method may be performed in an apparatus for depositing a $Ga_2O_3$ crystal film shown in FIG. 2.

As shown in FIG. 2, an apparatus for depositing a $Ga_2O_3$ crystal film according to the present invention includes a central supply channel 200 configured to supply GaCl gas and connected to a reaction portion, a bypass supply channel 210 separated from the central supply channel 200, configured to supply oxygen and HCl gas, and connected to the reaction portion 220, and the reaction portion 220 on which a $Ga_2O_3$ substrate is mounted and further includes heaters 233, 235, 237, 243, 245, and 247 configured to control the temperature of each reaction site.

The apparatus for depositing a $Ga_2O_3$ crystal film according to an embodiment of the present invention is characterized in that a source and reactant gas are supplied via separate supply channels, and particularly, HCl gas is further supplied via a separate bypass supply channel 210.

Specifically, this will be described with reference to the graph of FIG. 3 illustrating the flow rate of each gas component supplied via the central supply channel 200 and the bypass supply channel 210.

When explaining the contents of each column, the "individual line" indicates the type of raw material supplied through each line. The unit of flow rate of gas supplied through each line is standard cubic centimeter per minute (SCCM). The "ratio of flow (G1)" indicates the partial pressure with respect to the total gas supply flow rate in the G1 step in which deposition actually takes place.

In the "total flow", the total flow rate in each step is described, and it indicates the gas pressure of each line during six steps (loading, holding, substrate surface oxidation, GaCl gas preparation (Ga-T), deposition (G1), and unloading) commonly performed in a HVPE deposition process.

The gas supply behavior in each line is described as follows.

A background nitrogen line (background N2: BG_N2, 301) may supply background nitrogen so that gas does not flow backward even when a gas partial pressure changes rapidly during a reaction or even when a vortex is formed, and a constant proportion is maintained. Nitrogen, which is an inert gas, may be supplied in a proportion of 50% or more to both the central supply channel 200 and the bypass supply channel 210. The background nitrogen line 301 may maintain a constant value during the six steps.

Nitrogen, which is an inert gas, may be further supplied via the central supply channel 200. A balance nitrogen line (balance N2, 303) may supply balance nitrogen to finely adjust internal pressure. Balance nitrogen may be supplied to finely adjust the quality of a deposited surface. Balance nitrogen may maintain a constant value during the six steps and may be adjusted for a deposition process as necessary.

A bypass nitrogen supply line (O2_N2, 311) may supply nitrogen to the bypass supply channel 210. The bypass supply channel 210 is a channel for supplying oxygen, but when only oxygen is supplied, it is difficult to uniformly maintain a reaction rate in all regions. Oxygen may be supplied after being diluted by mixing oxygen with nitrogen which is an inert gas. Nitrogen supplied via the bypass supply channel 210 may also maintain a constant value during the six steps.

A central nitrogen supply line (Ga_HCl_N2, 305) may supply nitrogen to the central supply channel 200. The central supply channel 200 is a reaction section in which HCl gas reacts with gallium to form GaCl gas. In this case, HCl gas needs to be diluted to control a reaction rate, and an inert gas is further supplied for the dilution. The supplied nitrogen may be about 10 times the supplied HCl gas. The central nitrogen supply line 305 may maintain the supply flow rate of nitrogen at a constant value during the six steps.

The reactant gas is controlled differently in each step. In a section (loading and holding) for mounting a substrate and maintaining a gas flow, GaCl gas and oxygen, which are reactant gases, are not supplied. In the substrate surface oxidation step, only oxygen is supplied via the bypass supply channel 210. In the GaCl gas preparation (Ga-T) step, HCl gas, which is a halogen acid, is supplied via the central supply channel 200 so that GaCl gas uniformly flows. Then, in the deposition (G1) step in which the reaction takes place, oxygen and HCl gas are supplied via the bypass supply channel 210, and GaCl gas is continuously supplied via the central supply channel 200 to induce deposition. Then, in the unloading step, the supply of all the reactant gases is stopped.

The process of a supply line of each reactant gas is as follows.

An oxygen line (O2, 315) may supply oxygen to the bypass supply channel 210 in the substrate surface oxidation step and the deposition (G1) step in which the reaction takes place, and the supply of oxygen may be stopped in the remaining steps. Depending on the type of substrate, when a surface polishing process is performed right before deposition, surface deposition may be difficult due to the removal of an oxide film on the surface. Oxygen is supplied onto the substrate for a certain period of time by performing the oxidation step prior to the G1 step. When oxygen is supplied, an oxide film may be formed on the substrate surface. Then, the supply of oxygen is stopped.

In the GaCl gas preparation step after the substrate oxidation is terminated, a central hydrochloric acid supply line (Ga_HCl, 307) may supply HCl gas to the central supply channel 200. Since this is a step for avoiding the non-uniformity of the time required for an initial reaction between HCl gas and gallium, HCl gas may be supplied in an amount smaller than the amount of GaCl gas input during deposition.

In the deposition (G1) step, the central hydrochloric acid supply line 307 continues to supply HCl gas to the central supply channel 200, and the supply flow rate may increase as necessary. Also, the oxygen line 315 supplies oxygen again. When oxygen is insufficiently supplied, GaCl gas may not sufficiently react with oxygen and thus may be exhausted as it is. To prevent wastage of a gallium raw material, oxygen may be supplied in excess compared to GaCl gas. HCl gas supplied via the central hydrochloric acid supply line 307 may be supplied at a partial pressure of about 5% relative to oxygen.

In the G1 step in which the reaction takes place, HCl gas is further supplied via the bypass supply channel 210. Since HCl gas is also a raw material used to halogenate gallium, it may be used as a single source. A bypass hydrochloric acid supply line (HCl, 313) may supply HCl gas in a proportion of 1% or more compared to oxygen supplied in the G1 step and supply HCl gas in a proportion of 20% or more compared to HCl gas supplied by the central hydrochloric acid supply line 307. The bypass hydrochloric acid supply line 313 may supply HCl gas only in the G1 step, and the supply of HCl gas may be stopped in the remaining steps.

As described above, a crystal film deposition process that allows surface defects to be reduced may be performed by precisely controlling the ratio of GaCl gas supplied via the central supply channel 200 and HCl gas supplied using the bypass supply channel 210.

FIG. 4 is a graph illustrating a control temperature of each block in the method according to FIG. 1 to FIG. 3.

As shown in FIG. 2, the rear ends of the central supply channel 200 and the bypass supply channel 210 are connected to the reaction portion 220.

In the central supply channel 200, HCl gas reacts with gallium to produce GaCl gas, and in the reaction portion 220, the GaCl gas reacts with oxygen. Since raw materials supplied via the central supply channel 200 and the bypass supply channel 210 need to be supplied to the reaction portion 220 at a similar temperature (reaction temperature), they are preferably heated together.

The central supply channel 200 and the bypass supply channel 210 are preferably controlled at 450° C. or more and 900° C. or less which is a temperature range suitable for a reaction between HCl gas and gallium. The reaction portion 220 is preferably controlled at a high temperature for reacting GaCl gas with oxygen and minimizing defects during deposition. Specifically, the reaction portion 220 is preferably controlled at 850° C. or more and 1150° C. or less. Since the control temperature of the reaction portion 220 is higher than that of the central supply channel 200 and the bypass supply channel 210, the temperature is preferably gradually increased in a region between the central supply channel 200 and the bypass supply channel 210 and the reaction portion 220.

Therefore, the central supply channel 200 and the bypass supply channel 210 are preferably controlled so that the temperatures thereof gradually increase from an inlet to a region where the GaCl gas moves by evaporation.

Specifically, the central supply channel 200 and the bypass supply channel 210 may be divided into an injection portion 233, an evaporation portion 235, and a transfer portion 237 from an inlet to a region where the GaCl gas moves by evaporation, the injection portion 233 may be controlled at 450° C. or more and 650° C. or less, the evaporation portion 235 may be controlled at 550° C. or more and 750° C. or less, and the transfer portion 237 may be controlled at 750° C. or more and 900° C. or less.

In addition, the reaction portion 220 may be divided into an introduction portion 243, a deposition portion 245, and a discharge portion 247 from a region close to the central supply channel 200 and the bypass supply channel 210 to a region where a reaction gas is discharged, the introduction portion 243 may be controlled at 950° C. or more and 1150° C. or less, the deposition portion 245 may be controlled at 900° C. or more and 1050° C. or less, and the discharge portion 247 may be controlled at 850° C. or more and 950° C. or less.

Figure 5:
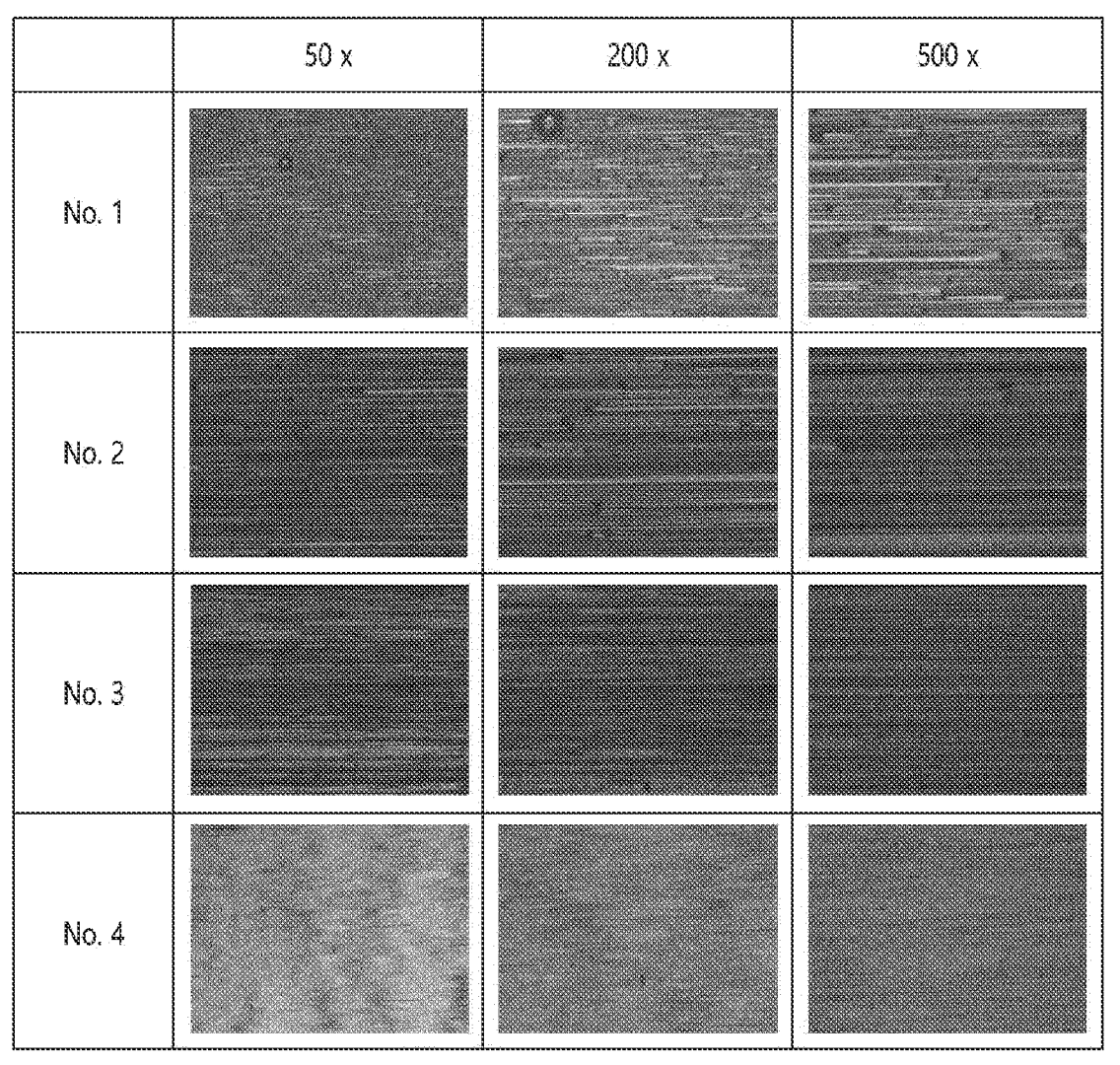

FIG. 5 is a table showing images obtained by photographing surfaces according to a comparative example and examples shown in Tables 1 and 2 with an optical microscope at 50×, 200×, and 500×.

No. 1 is a substrate when HCl gas is not added via a bypass supply channel, No. 2 is a substrate deposited by supplying HCl gas at a flow rate of 20 SCCM via a bypass supply channel, No. 3 is a substrate deposited by supplying HCl gas at a flow rate of 40 SCCM via a bypass supply channel, and No. 4 is a substrate deposited by supplying HCl gas at a flow rate of 60 SCCM via a bypass supply channel. This is the experimental result of growth conducted by varying only the flow rate of HCl gas supplied via a bypass supply channel as a variable in the control graphs of FIGS. 3 and 4.

Growth conditions and measurement results of surface properties are shown in Table 1.

TABLE 1

| | Growth conditions (SCCM) | | | | Surface properties | | | |
|---|---|---|---|---|---|---|---|---|
| Items | Ga_HCl | Side_HCl | O2 | Growth Time(min) | FWHM of RC (002) (arcsec) | FWHM of RC (−402) (arcsec) | Ra (nm) | Rt (nm) |
| No. 1 | 100 | 0 | 2000 | 6 | 129 | 99 | 1877.00 | 2263.00 |
| No. 2 | 100 | 20 | 2000 | 90 | 89 | 38 | 254.78 | 2312.28 |
| No. 3 | 100 | 40 | 2000 | 90 | 59 | 89 | 71.47 | 1113.05 |
| No. 4 | 100 | 60 | 2000 | 90 | 19 | 29 | 11.42 | 203.20 |

In this case, roughness was measured using a Dektak 150 surface profiler, and a full width at half maximum (FWHM) was measured using Panalytical X'pert Pro MRD.

When No. 1, which is a comparative example, and No. 2 to No. 4, which are examples, were compared, it can be confirmed that as the flow rate of HCl gas input was increased, surface roughness and a FWHM were decreased. Therefore, it can be seen that it is helpful for decreasing roughness and improving crystallinity when GaCl gas is oxidized and deposited in an oxidizing atmosphere created by further supplying a highly reactive gas, instead of when GaCl gas is oxidized and deposited, after the supply of GaCl gas.

When a ratio of the amount of HCl gas supplied via a central supply channel and the amount of HCl gas supplied via a bypass supply channel was 5:1 (No. 2), average roughness was substantially decreased, and a FWHM was also decreased, so it can be seen that crystallinity is improved. When a ratio of the amount of HCl gas supplied via a central supply channel and the amount of HCl gas supplied via a bypass supply channel was 5:2 (No. 3), maximum roughness (Rt) was substantially decreased. Also, when a ratio of the amount of HCl gas supplied via a central supply channel and the amount of HCl gas supplied via a bypass supply channel was 5:3 (No. 4), crystallinity was improved, and both maximum roughness and average roughness were substantially decreased.

Figure 6A:
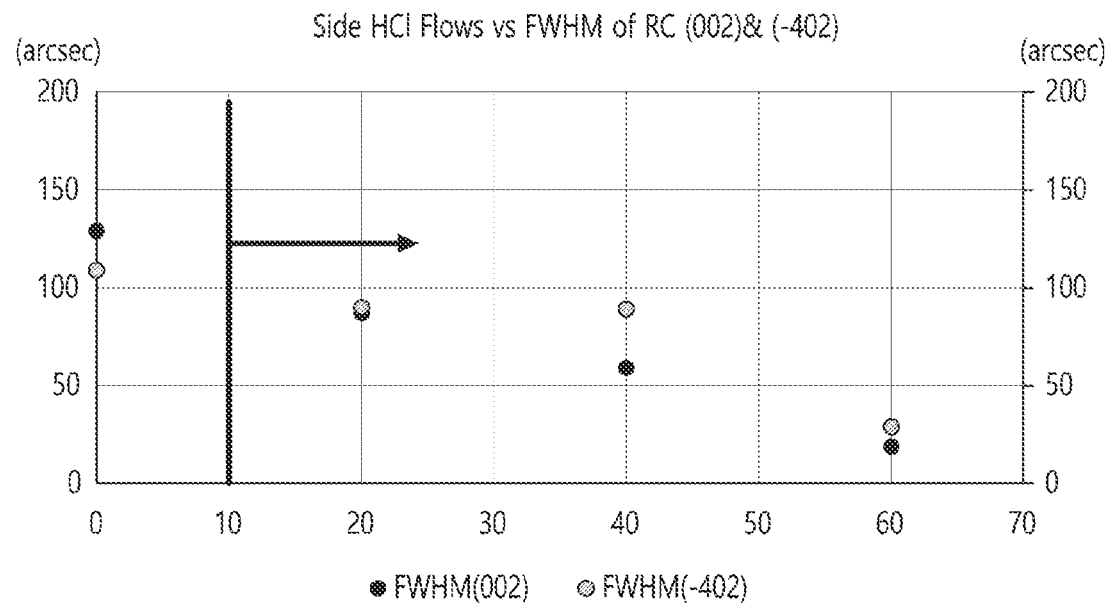
FIG. 6A is a graph illustrating a flow rate of HCl gas supplied via a bypass supply channel and a full width at half maximum (FWHM) for (002) and (−402) planes.
Figure 6B:
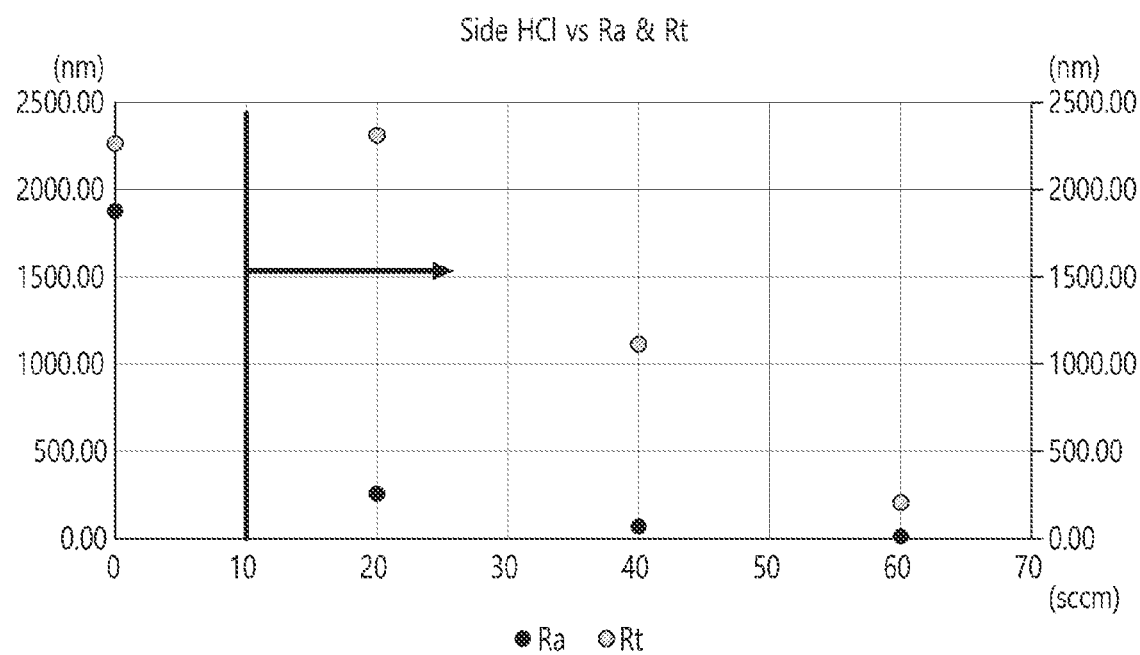
FIG. 6B is a graph illustrating a flow rate of HCl gas supplied via a bypass supply channel and the roughness (Ra and Rt) of the grown surface.

FIG. 6A is a graph illustrating a flow rate of HCl gas supplied via a bypass supply channel and a full width at half maximum (FWHM) for (002) and (−402) planes, and FIG. 6B is a graph illustrating a flow rate of HCl gas supplied via a bypass supply channel and the roughness (Ra and Rt) of the grown surface.

FIG. 6A and FIG. 6B are graphs illustrating the contents described in Table 1. As shown in Table 1, it can be confirmed that when the flow rate of HCl gas supplied via a bypass supply channel was more than 10 SCCM, crystallinity was substantially improved, and surface roughness was also substantially decreased.

Specifically, it can be confirmed that when HCl gas was supplied at 20 SCCM or more via a bypass supply channel (i.e., when a ratio of HCl gas supplied via a bypass supply channel and HCl gas supplied via a central supply channel was 1:5 or more), a Ra value could be controlled to be 300 nm or less, and a FWHM value of 100 arcsec or less could be maintained.

In addition, it can be confirmed that when HCl gas was supplied at 40 SCCM or more via a bypass supply channel (i.e., when a ratio of HCl gas supplied via a bypass supply channel and HCl gas supplied via a central supply channel was 2:5 or more) as in No. 3, a Rt value of 1150 nm or less could be maintained.

Additionally, when HCl gas was supplied at 60 SCCM or more via a bypass supply channel as in No. 4, a FWHM value of 30 arcsec or less, a surface roughness Ra of 11.42 nm or less, and a surface roughness Rt of 203.20 nm or less could be maintained.

As shown in Table 1 and images of No. 1 to No. 4 in FIG. 5, it can be confirmed that as the flow rate of HCl gas supplied via a bypass supply channel was increased, a decrease in surface roughness was exhibited, and roughness was substantially decreased compared to when HCl gas was not supplied at all (No. 1 in FIG. 5).

Specifically, when $Ga_2O_3$ is deposited, curves are generated in the direction in which the source gas for growth passes. In this case, the linear dents generated on the surface are called pits.

The roughness may also be defined by counting the number of pits in a 500× magnified optical image. Specifically, the number of pits in a photographed 241.4 μm×181.1 μm optical image are counted, and the number of pits per unit area are shown in Table 2.

TABLE 2

| No. | Number of pits | HCl gas ratio of central supply channel and bypass supply channel | Note |
| --- | --- | --- | --- |
| No. 1 | $2.15 \times 10^5/cm^2$ | 1:0 | Comparative Example |
| No. 2 | $4.57 \times 10^4/cm^2$ | 10:2 | Example |
| No. 3 | $2.29 \times 10^4/cm^2$ | 10:4 | Example |
| No. 4 | $1.14 \times 10^4/cm^2$ | 10:6 | Example |

In the case of No. 2 in which the largest number of pits were generated among the examples, the number of pits generated was 20% or less smaller than that of No. 1 which is a comparative example, and thus polishing could be easily performed. When the density of pits was less than $4.57 \times 10^4/cm^2$, surface defects could be removed even by less polishing.

Preferably, the ratio of HCl gas supplied via a central supply channel and a bypass supply channel may be 10:4 or less and 10:6 or more. In this case, as shown in FIG. 6, an Rt value of 1150 nm or less and a pit density of $2.29 \times 10^4/cm^2$ or less could be maintained.

In addition, when the ratio of HCl gas supplied via a central supply channel and a bypass supply channel was 10:6 or more, a pit density of $1.14 \times 10^4/cm^2$ or less could be maintained, and a FWHM value for (002) and (−402) planes of 30 arcsec or less could be maintained. Also, a surface roughness Ra of 11.42 nm or less and a surface roughness Rt of 203.20 nm or less could be maintained.

Figure 7:
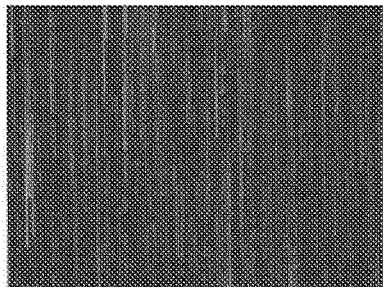
FIG. 7 shows images obtained by photographing surfaces before and after surface polishing with an optical microscope at 50×.
Figure 7:
Figure 7:
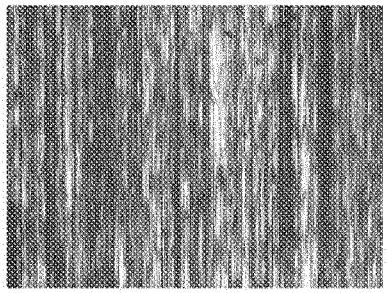
Figure 7:
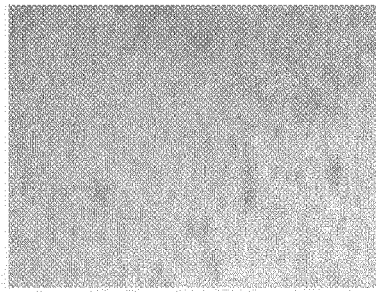
Figure 7:
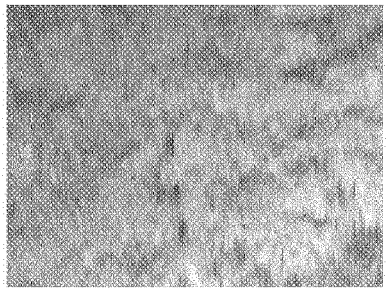
Figure 7:
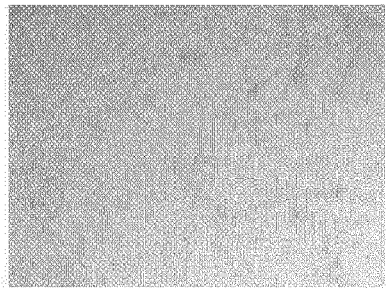

FIG. 7 shows images obtained by photographing surfaces before and after surface polishing with an optical microscope at 50×.

Since the substrate surface right after surface deposition (As grown) is rough, polishing needs to be performed until all defects on the surface are removed to perform the subsequent deposition process. In this case, the required degree of surface polishing is determined according to the depth of defects. In other words, when all of the rough curves formed on the surface (including the deepest curves) are polished, the resultant surface is able to be used as a subsequent deposition surface.

The polishing of the substrate shown in FIG. 7 was made by uniformly applying a pressure of 100 g/cm² using a silica slurry as a polishing agent.

No. 2 was polished to an extent that deposition was possible after being polished for 180 minutes.

No. 3 was polished to an extent that deposition was possible after being polished for 120 minutes.

No. 4 was polished to an extent that deposition was possible after being polished for 60 minutes.

No. 1, which is a comparative example, was not polished to an extent that deposition was possible (epi-ready) even when polished under the same conditions for 180 minutes or more, whereas the examples exhibited an effect of substantially reducing the required polishing time.

Polishing needs be performed until all of the curves disappear, so it is proportional to a maximum roughness (Rt) value. However, even when the maximum roughness is high, the required polishing time may vary depending on the pattern of roughness. The roughness decrease effect according to the present invention not only decreases pit density but also reduces the required polishing time.

Figure 8:
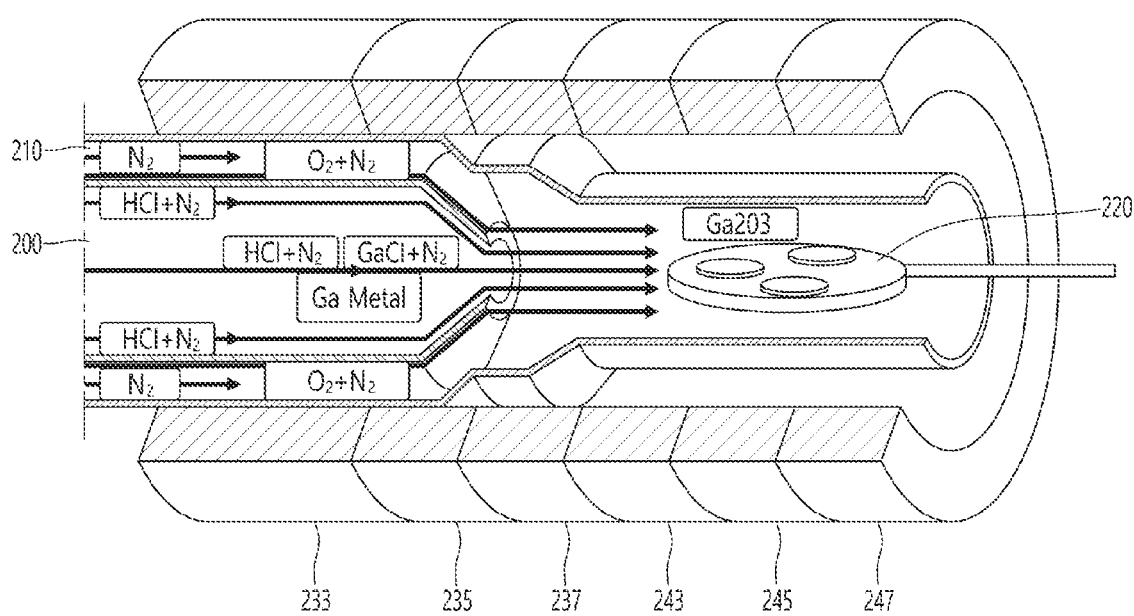
FIG. 8 is a conceptual diagram illustrating a reaction process of a $Ga_2O_3$ deposition apparatus when an excessive amount of HCl gas is input into a central supply channel.

The degree of optimization of the amount of HCl gas input into the central supply channel 200 is confirmed with reference to FIGS. 8 to 10.

FIG. 8 is a conceptual diagram illustrating a reaction process of a $Ga_2O_3$ deposition apparatus when an excessive amount of HCl gas is input into a central supply channel.

The configuration and heating method are the same as those of FIG. 2, but the roughness of the substrate is minimized by varying the amount of HCl gas input into the central supply channel 200 rather than the flow rate of HCl gas supplied via the bypass supply channel 210.

Figure 9A:
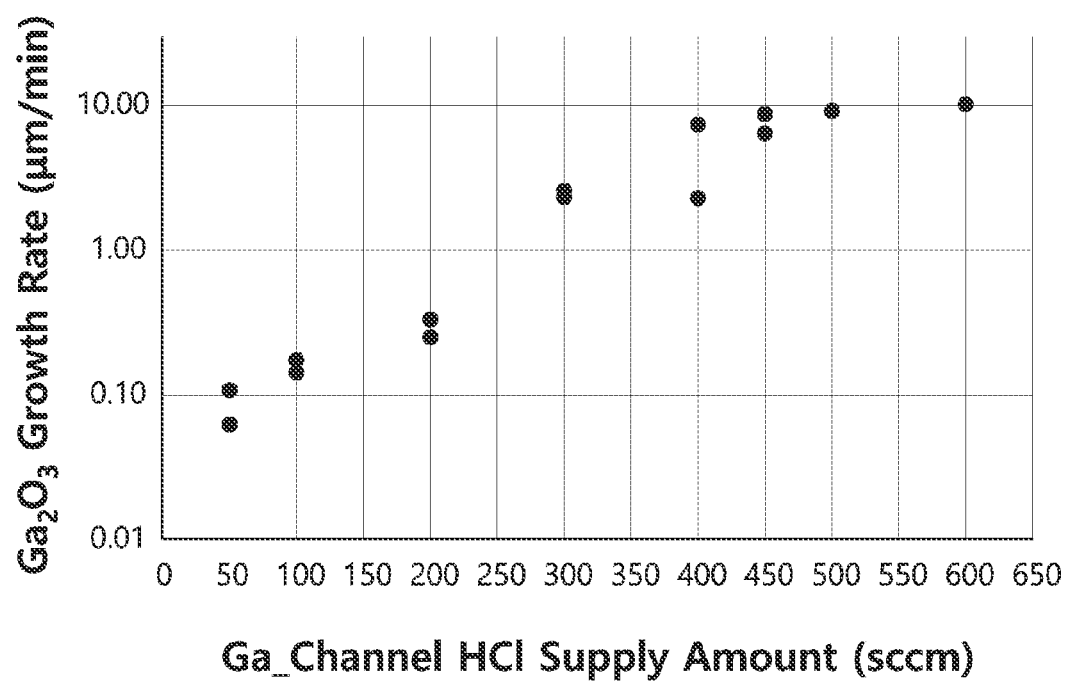
FIG. 9A is a graph illustrating an amount of HCl gas input into a central supply channel and a growth rate of $Ga_2O_3$.
Figure 9B:
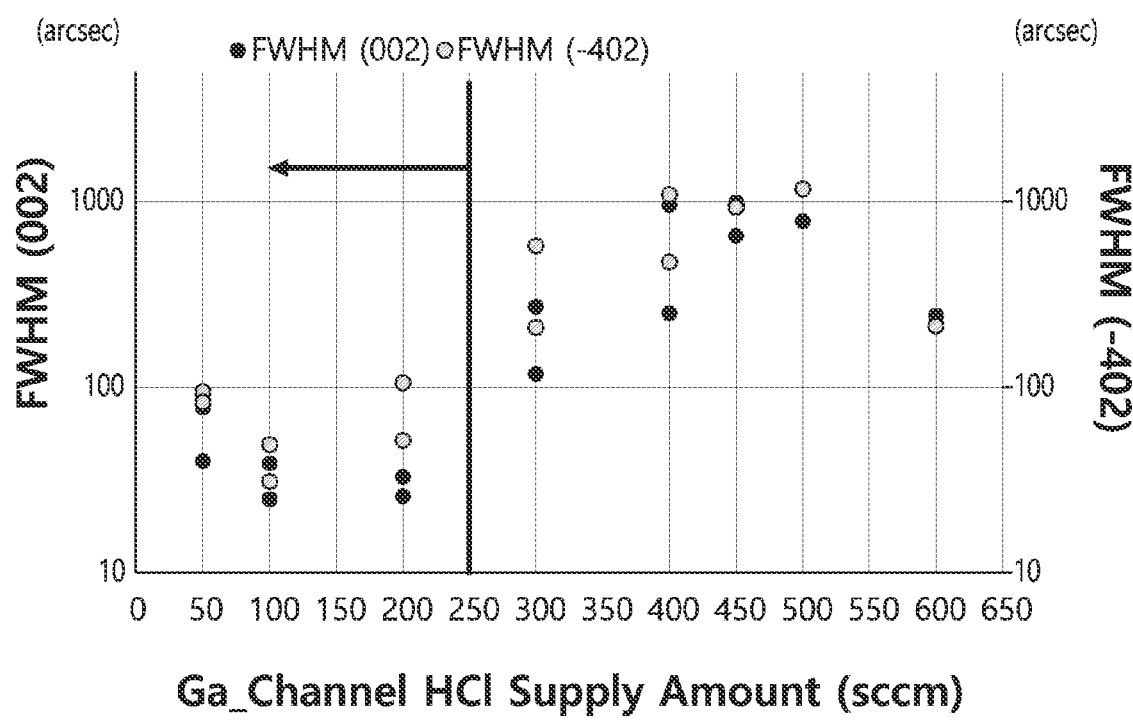
FIG. 9B is a graph illustrating a flow rate of HCl gas supplied via a central supply channel and a full width at half maximum (FWHM) for (002) and (−402) planes.

FIG. 9A is a graph illustrating an amount of HCl gas input into a central supply channel and a growth rate of $Ga_2O_3$, and FIG. 9B is a graph illustrating a flow rate of HCl gas supplied via a central supply channel and a full width at half maximum (FWHM) for (002) and (-402) planes. The unit of a FWHM is arcsec.

The flow rate of HCl gas supplied via the central supply channel 200 when a crystal film grows is preferably more than 50 SCCM and 250 SCCM or less.

When HCl gas supplied via the central supply channel 200 substantially increases, most of the HCl gas may react with gallium to form GaCl gas. The GaCl gas reacts with an excessive amount of oxygen and thus deposited. Therefore, as shown in FIG. 9A, a growth rate substantially increases. In particular, when HCl gas is supplied at 250 SCCM or more via the central supply channel 200, a deposition rate of gallium oxide is substantially improved.

An increase in FWHM means that various crystal structures are mixed. Referring to FIG. 9B, it can be confirmed that when HCl gas was supplied at 250 SCCM or more (at which the growth rate increases) via the central supply channel 200, crystal quality was rapidly degraded.

In addition, referring to FIG. 9B, it can be confirmed that when HCl gas was supplied at 100 SCCM, a FWHM value was lower than that when HCl gas was supplied at 50 SCCM. Therefore, supplying HCl gas at 100 SCCM or more rather than 50 SCCM via the central supply channel 200 is helpful for improving crystallinity. Therefore, the flow rate of HCl gas supplied via the central supply channel 200 when a crystal film grows is preferably more than 50 SCCM and 250 SCCM or less.

Figure 10A:
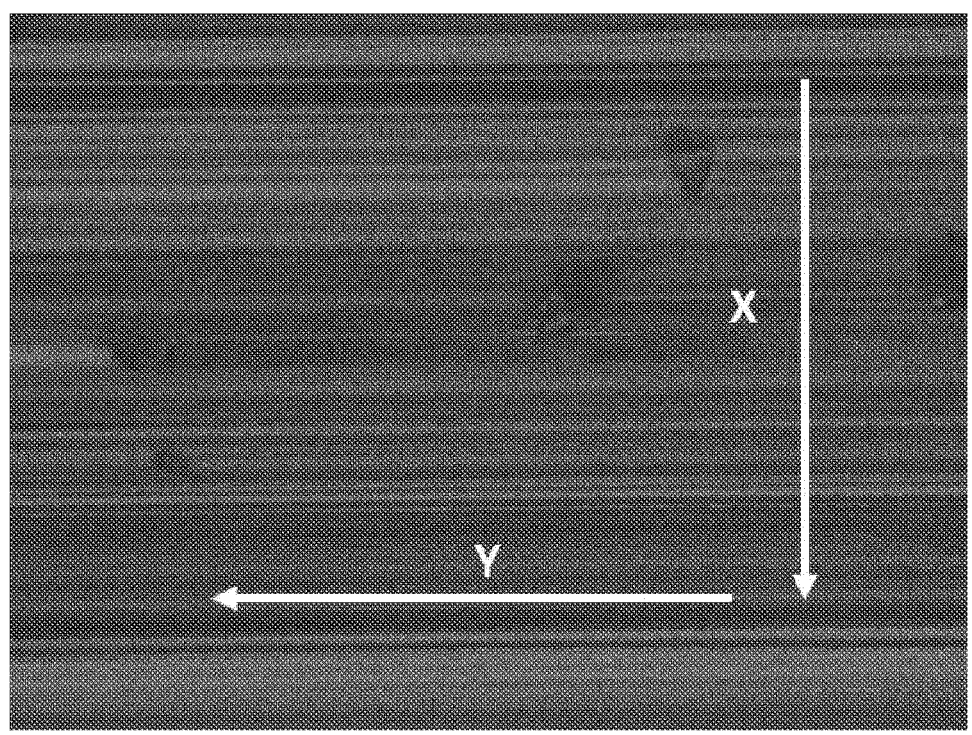
FIG. 10A is a surface image in which X and Y are marked on the deposited surface to define X and Y directions.
Figure 10B:
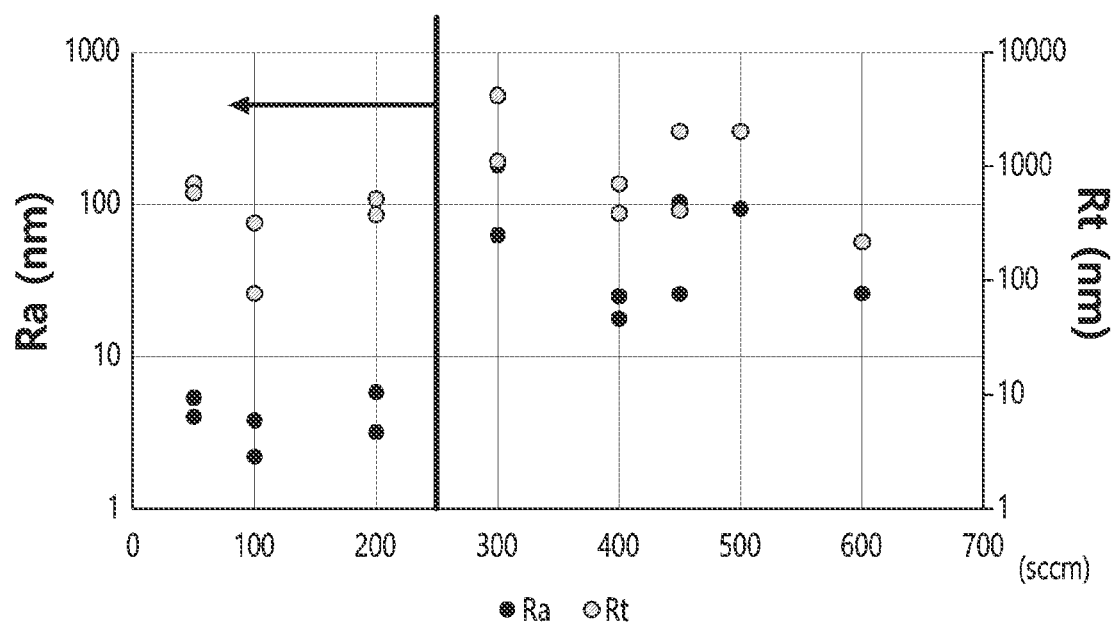
FIG. 10B is a graph illustrating a comparison of surface roughness (Ra and Rt) in the X direction with the flow rate of HCl gas supplied via a central supply channel.
Figure 10C:
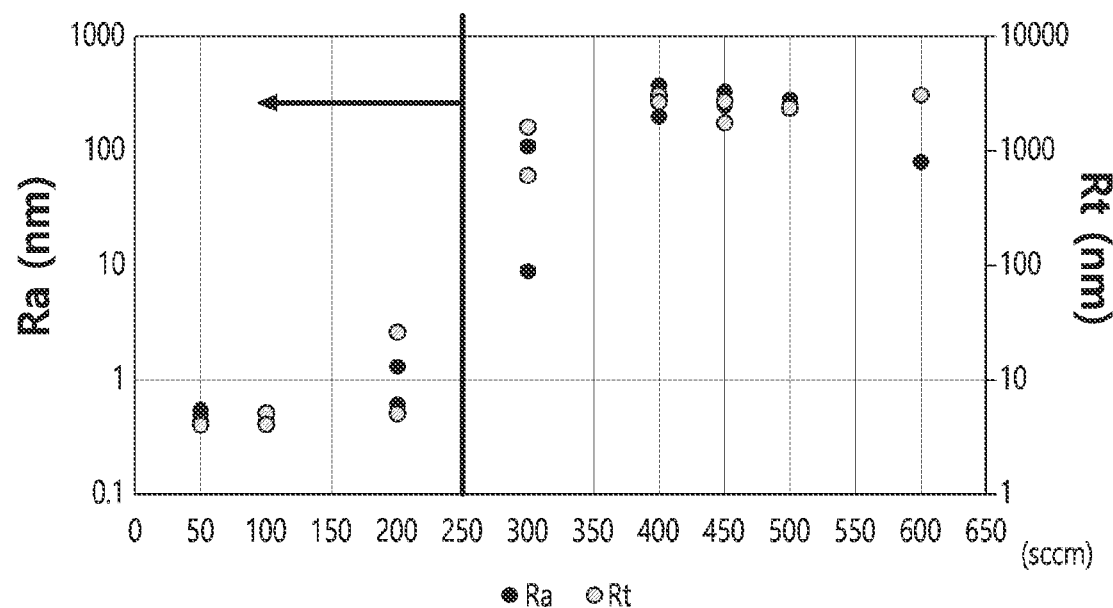
FIG. 10C is a graph illustrating a comparison of surface roughness (Ra and Rt) in the Y direction with the flow rate of HCl gas supplied via a central supply channel.

FIG. 10A is a surface image in which X and Y are marked on the deposited surface to define X and Y directions, FIG. 10B is a graph illustrating a comparison of surface roughness (Ra and Rt) in the X direction with the flow rate of HCl gas supplied via the central supply channel 200, and FIG. 10C is a graph illustrating a comparison of surface roughness (Ra and Rt) in the Y direction with the flow rate of HCl gas supplied via the central supply channel 200. In each figure, the horizontal axis is the flow rate of supplied HCl gas, and the unit thereof is SCCM.

As shown in FIG. 10A, the same direction as the supply direction of deposition gas is defined as Y, and a direction perpendicular to the supply direction of deposition gas is defined as X.

The flow rate of HCl gas supplied via the central supply channel 200 to minimize roughness in the X-axis direction when a crystal film grows is preferably more than 50 SCCM and 250 SCCM or less.

Referring to FIG. 10B, it can be confirmed that when the flow rate of HCl gas supplied via the central supply channel 200 was 250 SCCM or less, roughness in the X-axis direction was substantially decreased. Also, it can be confirmed that when the flow rate was more than 50 SCCM, roughness was temporarily decreased. Therefore, when the flow rate of HCl gas supplied via the central supply channel 200 is maintained to be more than 50 SCCM and 250 SCCM or less, roughness in the X-axis direction can be minimized.

In addition, the flow rate of HCl gas supplied via the central supply channel 200 to minimize roughness in the Y-axis direction when a crystal film grows is preferably 250 SCCM or less.

Referring to FIG. 10C, it can be confirmed that when the flow rate of HCl gas supplied via the central supply channel 200 was 250 SCCM or less, roughness in the Y-axis direction was substantially decreased. Therefore, when the flow rate of HCl gas supplied via the central supply channel 200 is maintained to be 250 SCCM or less, roughness in the Y-axis direction can be minimized.

FIG. 11 is a table illustrating examples and comparative examples of the method of depositing $Ga_2O_3$ according to HVPE according to an embodiment of the present invention. The serial number listed in the first column is an experiment number.

The flow rate of HCl gas supplied via the central supply channel is preferably 100 SCCM or more and 200 SCCM or less. The most dominant factor that determines crystallinity and defects in deposition is a deposition rate, and the deposition rate depends on the amount of HCl gas supplied via the central supply channel. Referring to the experiments of Experiment Nos. 2, 4, 6, 9, and 11 in the table, the crystallinity and roughness of a deposited surface when HCl gas is input at 20 SCCM into the bypass supply channel can be compared with those when HCl gas is supplied at the same flow rate via the central supply channel.

It can be confirmed that when the flow rate of HCl gas supplied via the central supply channel was 200 SCCM or less, the crystallinity and roughness of a deposited surface were maintained with almost no change, and when the flow rate was more than 300 SCCM, crystallinity was substantially decreased, and roughness was substantially increased.

In addition, when HCl gas was not further supplied via the bypass supply channel, low crystallinity and very high roughness were exhibited.

Therefore, it is preferable that the flow rate of HCl gas supplied via the central supply channel in a deposition process is less than 300 SCCM, and HCl gas is further supplied via the bypass supply channel.

According to the present invention, an improvement in the crystallinity of a deposited surface and a reduction of defects can be realized by supplying GaCl gas via the central supply channel and supplying oxygen and HCl gas onto a deposited substrate.

According to the present invention, minimization of defects on a deposited surface and maintenance of a growth rate can be realized by maintaining a ratio of GaCl gas and HCl gas in 5:1 to 5:4.

According to the present invention, a ratio of GaCl gas and HCl gas on a deposited substrate can be precisely controlled by supplying HCl gas to GaCl gas via the bypass supply channel.

According to the present invention, the polishing time for removing defects can be minimized by forming a deposited surface in the as-grown state to have a defect density of $4.57 \times 10^4 / cm^2$ or less.

According to any one of the above-described aspects of the present invention, an embodiment of the present invention can provide a $Ga_2O_3$-deposited substrate which has a deposited surface with minimum surface defects regardless of a deposition direction.

According to any one of the above-described aspects of the present invention, an embodiment of the present invention can manufacture a substrate in which the time required for surface polishing (chemical-mechanical polishing; CMP) after product deposition is minimized.

It should be construed that the scope of the present invention is defined by the appended claims rather than the detailed description and that all changes or modifications derived from the meaning and scope of the claims and equivalent concepts thereof are encompassed in the scope of the present invention.

What is claimed is:

1. A method of depositing a $Ga_2O_3$ crystal film according to hydride vapor phase epitaxy (HVPE), comprising:
   a first step of supplying GaCl gas onto a single-crystal semiconductor substrate via a central supply channel,
   wherein the first step comprises:
   an oxidation step of supplying only first oxygen, and wherein the oxidation step is performed before the supplying GaCl gas; and
   a second step of supplying second oxygen and HCl gas onto the single-crystal semiconductor substrate onto which the GaCl gas is supplied,
   wherein the second step comprises:
   a deposition step of supplying both the second oxygen and the HCl gas,
   wherein the HCl gas is supplied via both the central supply channel and a bypass supply channel separated from the central supply channel, a flow rate of the HCl gas supplied via the central supply channel is more than 100 SCCM to 200 SCCM, and a flow rate of the HCl gas supplied via the bypass supply channel is 20 SCCM or more,
   wherein the single-crystal semiconductor substrate is a $\beta$-$Ga_2O_3$ substrate, and
   wherein the $Ga_2O_3$ crystal film on the single-crystal semiconductor substrate is a $\beta$-$Ga_2O_3$ film.

2. The method of claim 1, wherein the HCl gas supplied via the bypass supply channel is supplied along with nitrogen.

3. The method of claim 1, wherein a ratio of the partial pressures of the HCl gas supplied via the bypass supply channel and the GaCl gas is equal to or more than 1:5.

4. The method of claim 3, wherein a ratio of the partial pressures of the HCl gas supplied via the bypass supply channel and the GaCl gas is equal to or more than 2:5.

5. The method of claim 4, wherein a ratio of the partial pressures of the GaCl gas and the HCl gas supplied via the bypass supply channel is more than 5:4.

6. The method of claim 1, wherein the first step includes supplying an initial HCl gas at a flow rate of 50 to 300 SCCM, such that a source of Ga metal is exposed to the initial HCl gas.

* * * * *